(12) United States Patent
Brown et al.

(10) Patent No.: US 10,354,717 B1
(45) Date of Patent: Jul. 16, 2019

(54) REDUCED SHIFTER MEMORY SYSTEM

(71) Applicant: Micron Technology, Inc., Boise, ID (US)

(72) Inventors: Jason M. Brown, Allen, TX (US); Vijayakrishna J. Vankayala, Allen, TX (US); William C. Waldrop, Allen, TX (US); Kallol Mazumder, Plano, TX (US); Byung S. Moon, Plano, TX (US); Ravi Kiran Kandikonda, Frisco, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/976,698

(22) Filed: May 10, 2018

(51) Int. Cl.
| | | |
|---|---|---|
| *G11C 11/4076* | (2006.01) | |
| *G11C 11/4093* | (2006.01) | |
| *G06F 11/10* | (2006.01) | |
| *G11C 11/4096* | (2006.01) | |

(52) U.S. Cl.
CPC .......... *G11C 11/4093* (2013.01); *G06F 11/10* (2013.01); *G11C 11/4076* (2013.01); *G11C 11/4096* (2013.01)

(58) Field of Classification Search
CPC .......... G11C 11/4093; G11C 7/22; G11C 8/12
USPC ....................................... 365/189.02, 230.03
See application file for complete search history.

(56) References Cited

U.S. PATENT DOCUMENTS

| | | | | |
|---|---|---|---|---|
| 3,905,022 A * | 9/1975 | Klosky | ................. | G06F 3/0489 715/210 |
| 4,211,997 A * | 7/1980 | Rudnick | .......... | G11B 20/10527 714/758 |
| 5,450,341 A * | 9/1995 | Sawada | ............... | G11C 11/5621 365/184 |
| 5,467,090 A * | 11/1995 | Baumgartner | ....... | A61B 5/0428 341/155 |
| 6,088,828 A * | 7/2000 | De Bart | ............ | H03M 13/2933 714/789 |
| 6,125,072 A * | 9/2000 | Wu | ....................... | G06F 3/0619 365/230.01 |
| 6,163,563 A * | 12/2000 | Baker | .................... | H04B 1/707 375/130 |
| 6,553,537 B1 * | 4/2003 | Fukuoka | ........... | H03M 13/1515 714/784 |
| 2002/0018389 A1 * | 2/2002 | Ito | ....................... | G06F 11/1008 365/222 |
| 2006/0251207 A1 * | 11/2006 | Paumier | ............... | G11C 19/287 377/64 |

(Continued)

*Primary Examiner* — Michael T Tran
(74) *Attorney, Agent, or Firm* — Perkins Coie LLP

(57) ABSTRACT

Aspects of the present disclosure eliminating the need for a memory device to have both a shifter that shifts input pin values from an input domain into a parity domain and another shifter that shifts a decoded command from the input domain into the parity domain. A memory device can achieve this by, when parity is being performed, shifting the input from the input pins into the parity domain prior to decoding the command. Using a multiplexer, the decoder can receive the command pin portion of the shifted input when parity checking is being performed and can receive the un-shifted command pin input when parity checking is not being performed. The decoder can use the command pin portion of the shifted input to generate shifted and decoded commands or can use the un-shifted command pin input to generate decoded commands.

17 Claims, 4 Drawing Sheets

(56) References Cited

U.S. PATENT DOCUMENTS

| | | | |
|---|---|---|---|
| 2008/0025389 A1* | 1/2008 | Markman | H04L 7/048 375/240.02 |
| 2009/0037791 A1* | 2/2009 | Pavlov | H03M 13/1131 714/752 |
| 2009/0041151 A1* | 2/2009 | Khan | H04L 5/0023 375/267 |
| 2009/0249148 A1* | 10/2009 | Ito | G06F 11/1008 714/746 |
| 2011/0161770 A1* | 6/2011 | Ueng | H03M 13/1137 714/752 |
| 2013/0346836 A1* | 12/2013 | Song | G06F 11/10 714/800 |
| 2015/0003531 A1* | 1/2015 | Sato | H04N 19/176 375/240.16 |
| 2015/0049695 A1* | 2/2015 | Aiba | H04L 5/0048 370/329 |
| 2015/0311918 A1* | 10/2015 | Pringle | H03M 13/1128 714/776 |
| 2015/0341053 A1* | 11/2015 | Kim | H03M 13/1102 714/776 |
| 2016/0127109 A1* | 5/2016 | Shimosakoda | H04B 17/309 370/276 |
| 2016/0241890 A1* | 8/2016 | Park | H04N 21/234 |
| 2017/0063400 A1* | 3/2017 | Zhang | H03M 13/1575 |
| 2017/0170846 A1* | 6/2017 | Ikegaya | H03M 13/116 |
| 2018/0314595 A1* | 11/2018 | Eichmeyer | G06F 11/1076 |

* cited by examiner

REDUCED SHIFTER MEMORY SYSTEM

TECHNICAL FIELD

Embodiments of the disclosure relate generally to improved memory systems with reduced shifter need that result in lower power consumption, fewer components, and reduced timing complexity.

BACKGROUND

A memory system can include one or more memory components that store data. A memory system can be for unpowered data storage, such as a solid-state drive (SSD), or can be a volatile memory component, such as RAM, cache, registers, etc. For example, a memory system can include memory devices such as non-volatile memory devices, volatile memory devices, or a combination of both. In general, a host system can utilize a memory system to store data at the memory devices of the memory system and to retrieve data stored at the memory system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

The techniques introduced here may be better understood by referring to the following Detailed Description in conjunction with the accompanying drawings, in which like reference numerals indicate identical or functionally similar elements.

DETAILED DESCRIPTION

Existing memory devices include two shifters, one that shifts input pin values from an input domain into a parity domain and another shifter that shifts a decoded command from the input domain into the parity domain. Having two shifters draws excess current to power both shifters, increases the number of gates needed to construct the memory device, and introduces a timing issue between the output of the two shifters.

Figure 1:
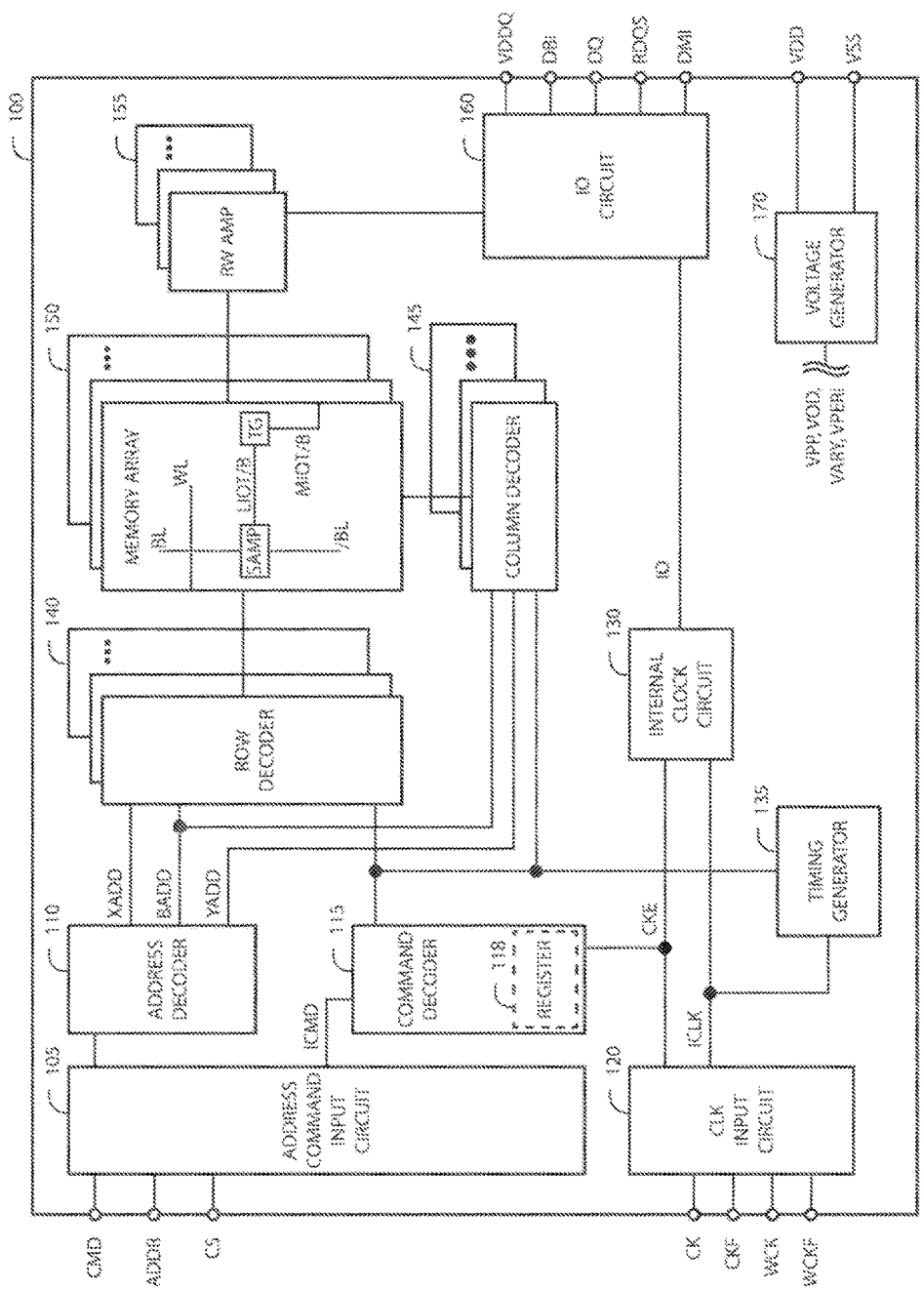
FIG. 1 is a block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals (e.g. "pins") that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal originating external to the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations. for example, a row command signal to select a word line and a column command signal to select a bit line. The internal command signals can also include output and input activation commands, such as clocked command CMDCK. The command decoder 115 may further include one or more registers 118 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in a mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The 10 clock signals can be supplied to the input/output circuit 160 and can be used as a timing signal for determining an output timing of read data and the input timing of write data. The 10 clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

The memory array 150 may be refreshed or maintained as described herein. A refresh operation, as described herein, may be initiated by a host device or memory controller, for example, and may include accessing one or more rows (e.g., WL) and discharging cells of the accessed row to a corresponding SAMP. While the row is opened (i.e., while the access WL is energized), the SAMP may compare the voltage resulting from the discharged cell to a reference. The SAMP may then write back a logic value (i.e., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization or the like. Other refresh schemes or methods may also be employed.

The memory array 150 may be refreshed or maintained using a per-bank scheme in which the same bank of memory array 150 may be refreshed several times before another bank of the same rank is refreshed. That is, the memory array 150 may be refreshed or maintained without restrictions on the order or frequency for which refresh or other maintenance operations may be taken on certain banks. Additionally or alternatively, banks of the memory array 150 may be maintained with greater freedom than legacy per-bank refresh restrictions have imposed.

Figure 2:
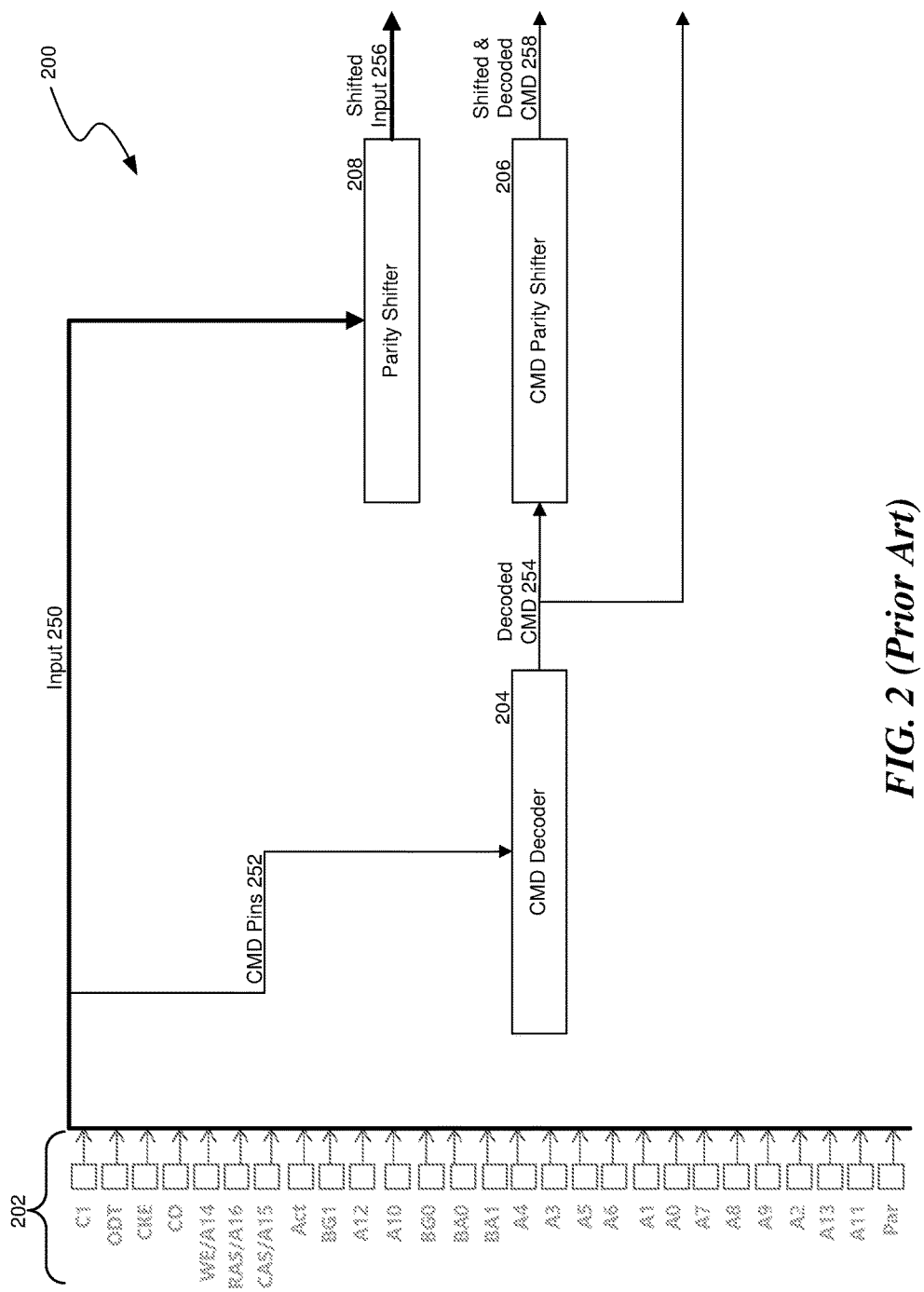
FIG. 2 is a block diagram of a portion of a memory device which includes a parity shifter and a separate command parity shifter that shifts decoded commands.

FIG. 2 shows a block diagram of a portion of an example memory device 200 which includes a parity shifter and a separate command parity shifter that shifts decoded commands. Memory device 200 receives inputs on input pins 202, which propagate down input lines 250. In the FIG. 2 example, there are 27 input pins. The inputs that encode a current command are provided, on CMD pin lines 252, from input lines 250 to CMD decoder 204. In some implementations, the CMD pins are pins C0, C1, WE, RAS, CAS, and Act, the inputs from which are transmitted on CMD pins lines 252. CMD decoder 204 decodes the inputs into a decoded command, which it outputs to decoded CMD line 254. In some implementations, there are 13 possible decoded commands, which include: activate, read, write, column, refresh, loadMode, pre0, pre1, cal, chipId0, chipId1, chipId2, and chipId3.

The decoded command passes on decoded CMD line 254 both to CMD parity shifter 206 and as an output for controlling aspects of the memory device when parity checking is not enabled. CMD parity shifter 206 shifts the command signal by a number of clock cycles used to perform parity checking on the data corresponding to the command. This moves the command from an input domain into a parity domain. Signals described as "in a domain" are synchronized such that signals in the same domain are in the same clock cycles for the domain. The shifted and decoded command is then output from CMD parity shifter 206 on shifted and decoded CMD line 258.

Also in the example in FIG. 2, input lines 250 also pass the inputs from input pins 202 to parity shifter 208. Parity shifter 208 shifts the inputs by the number of clock cycles used to perform parity checking on the data corresponding to the command so these input signals are also in the parity domain. The shifted inputs are then output from parity shifter 208 on shifted input lines 256. In some implementations, these shifted inputs can be used by the memory device when a parity error is detected.

In the example in FIG. 2, A) the memory device must provide power to operate both parity shifter 208 and CMD parity shifter 206, B) gating real estate and component cost are used to create both shifters, C) the shifted input and the shifted and decoded command have to be synchronized, creating a critical timing issue, and D) the shifted inputs and the shifted and decoded commands also need to be synchronized with unshifted command and inputs or else downstream timing issues can occur.

Aspects of the present disclosure address the above and other deficiencies by eliminating the need for a second shifter for the input from the command pins. A memory device can achieve this by, when parity is being performed, shifting the input from the input pins into the parity domain prior to decoding the command. Using a multiplexer, the decoder can receive the command pin portion of the shifted input when parity checking is being performed and can receive the un-shifted command pin input when parity checking is not being performed. The mux and command decoder alleviates the synchronization issue between shifted and unshifted commands. The decoder can use the command pin portion of the shifted input to generate shifted and decoded commands or can use the un-shifted command pin input to generate decoded commands.

Figure 3:
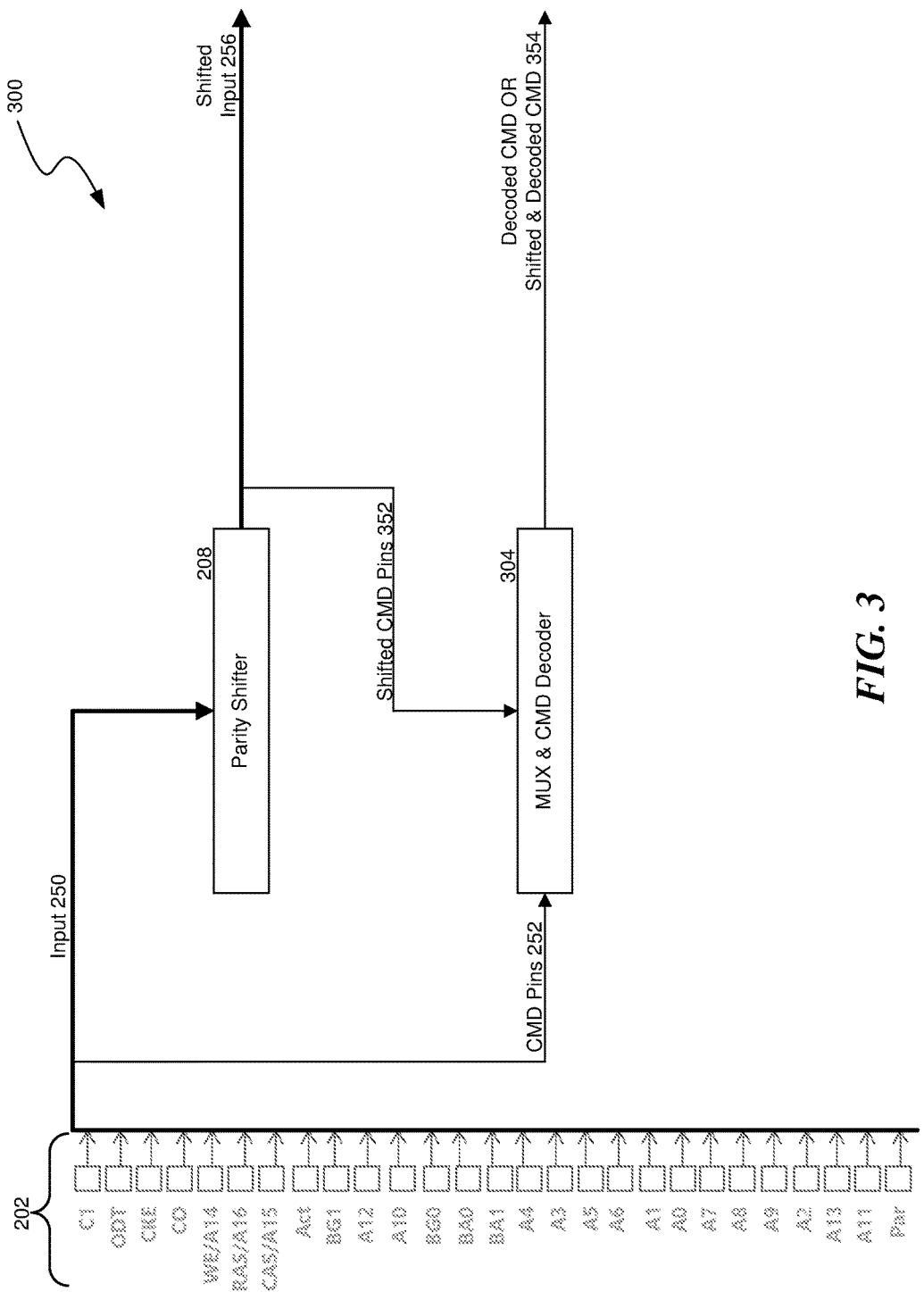
FIG. 3 is a block diagram of a portion of a memory device which includes a parity shifter that shifts input prior to command decoding, in accordance with an embodiment of the present disclosure.

FIG. 3 is a block diagram of a portion of a memory device 300 which includes a parity shifter that shifts input prior to command decoding. The memory device shown in FIG. 3 includes input pins 202, parity shifter 208, MUX and CMD decoder 304.

Multiple inputs from pins 202 are transmitted to parity shifter 208 on input lines 250. Parity shifter 208 receives the inputs and shifts them by a number of clock cycles used to perform parity checking on associated data (e.g. the parity latency). Parity shifter 208 produces shifted inputs on shifted input lines 256.

The shifted inputs that encode the command signal are transmitted on shifted CMD pins lines 352 to MUX and CMD decoder 304. In some implementations, these are the inputs from pins C0, C1, WE, RAS, CAS, and Act. In addition, inputs that encode the command signal when parity is not being performed are transmitted to MUX and CMD decoder 304 on CMD pins lines 252. A multiplexer of MUX and CMD decoder 304 outputs, to a decoder, the signals from shifted CMD pins lines 352 when parity checking is being performed and outputs the signals from CMD pins lines 252 when parity checking is not being performed. The decoder of MUX and CMD decoder 304 decodes the signal received from the multiplexer and outputs a command signal (parity shifted or not based on the multiplexer output) on decoded CMD or shifted & decoded CMD line 354. In some implementations, there are 13 possible decoded commands, which include: activate, read, write, column, refresh, loadMode, pre0, pre1, cal, chipId0, chipId1, chipId2, and chipId3. When parity is being performed, the output of the decoder is a shifted and decoded command. When parity is not being performed, the output of the decoder is a decoded command.

Figure 4:
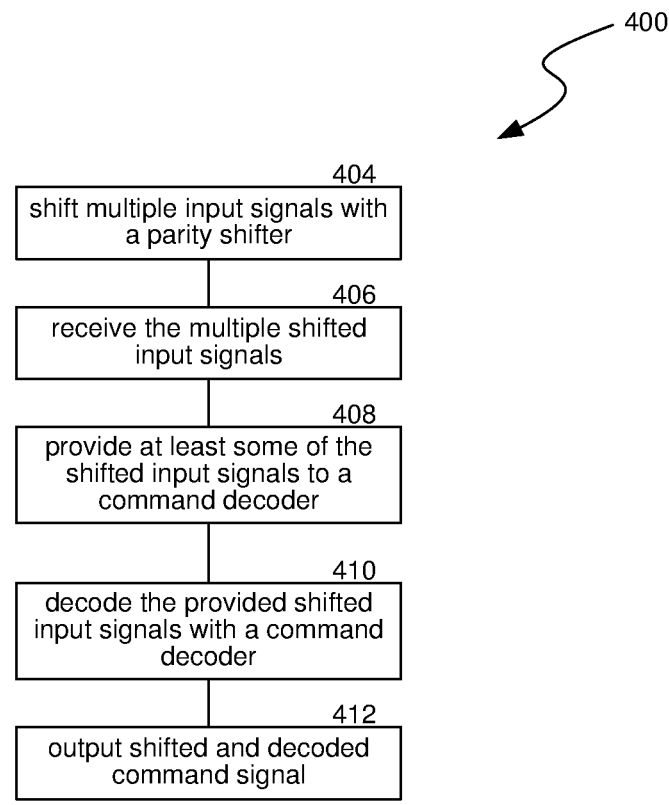
FIG. 4 is a flowchart illustrating a method of operating a memory device.

FIG. 4 is a flowchart illustrating a method 400 of operating a memory device. At block 404, method 400 uses a parity shifter to shift multiple input signals by a specified number of clock cycles. This shifting produces multiple shifted input signals, e.g. input signals that have been synchronized to data that is in another domain. In some implementations, the specified number of clock cycles that the parity shifter shifts the multiple inputs is based on a number of clock cycles used to perform parity checking. This can be the number of clock cycles used to perform parity checking or a modification of this number of clock cycles, e.g. the number of clock cycles used to perform parity checking incremented by an amount to account for other delay to correspond parity checked data or decremented by an amount to account for further delay between the shifting of a command and the shifted command reaching a destination.

At block 406, method 400 can receive the multiple shifted input signals from the parity shifter. In some implementations, these shifted input signals can be provided as output, e.g. to be used in determining details of an error identified by a parity check.

Method 400 can provide at least some of the shifted input signals, e.g. the shifted input signals that encode a command that the memory device is to perform, to a multiplexer. The multiplexer can also receive versions of these command signals that have not been shifted by the parity shifter and an indication of whether the memory device is performing a parity check. The multiplexer can provide the shifted input signals corresponding to the command in response to an indication of parity checking and can provide the input signals corresponding to the command that have not been shifted by the parity shifter when the multiplexer does not receive the indication of parity checking.

At block 408, when there is an indication of parity checking, method 400 can provide the shifted input signals encoding the command, from the multiplexer, to a command decoder. When there is not an indication of parity checking, method 400 can provide the input signals encoding the command that have not been shifted by the parity shifter, from the multiplexer, to the command decoder.

At block 410, method 400 can use the command decoder to decode the provided signals encoding the command (either parity shifted or not) into a command signal. At block 412, the command signal can be output. When there is not an indication of parity checking, the output command signal is a decoded command signal. When there is an indication of parity checking, the output command signal is a shifted and decoded command signal.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

In the foregoing specification, implementations of the disclosure have been described with reference to specific example implementations thereof. It will be evident that various modifications can be made thereto without departing from the broader spirit and scope of implementations of the disclosure as set forth in the following claims. Those skilled in the art will appreciate that the components illustrated in FIGS. 1-4, may be altered in a variety of ways. For example, the order of the logic may be rearranged, substeps may be performed in parallel, illustrated logic may be omitted, other logic may be included, etc. The specification and drawings are, accordingly, to be regarded in an illustrative sense rather than a restrictive sense.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. An apparatus, comprising:
a parity shifter configured to receive multiple inputs and provide multiple shifted input signals that are shifted by a specified number of clock cycles;
a command decoder configured to:
receive at least some of the shifted input signals corresponding to a command,
decode the received shifted input signals into a shifted and decoded command signal, and
output the shifted and decoded command signal; and
a multiplexer configured to:
receive the shifted input signals corresponding to the command, and
receive input signals corresponding to the command that have not been shifted by the parity shifter;
wherein the multiplexer is configured to provide the shifted input signals corresponding to the command to the command decoder in response to an indication of parity checking, and wherein the multiplexer is configured to provide the input signals corresponding to the command that have not been shifted by the parity shifter to the command decoder when the multiplexer does not receive the indication of parity checking.

2. The apparatus of claim 1,
wherein the outputting of the shifted and decoded command signal by the command decoder is in response to the multiplexer providing, to the command decoder, the shifted input signals corresponding to the command, and
wherein the command decoder outputs a decoded command signal that is not shifted for parity checking when the multiplexer provides, to the command decoder, the input signals corresponding to the command that have not been shifted by the parity shifter.

3. The apparatus of claim 1, wherein the specified number of clock cycles that the parity shifter shifts the multiple inputs corresponds to a number of clock cycles used to perform parity checking.

4. The apparatus of claim 1, wherein the apparatus is incorporated in a memory system.

5. The apparatus of claim 4, wherein the apparatus is a DRAM memory die and the memory device is DDR4 DRAM memory module.

6. The apparatus of claim 1,
wherein the apparatus further comprises input pins, and
wherein the multiple inputs are received via the input pins.

7. The apparatus of claim 6, wherein the at least some of the shifted input signals corresponding to the command comprise one or more of: C0, C1, WE, RAS, CAS, or Act pins, of the input pins.

8. The apparatus of claim 1, wherein the command signal is one of thirteen commands into which the command decoder can decode input signals.

9. A method of operating a memory device, comprising:
shifting, with a parity shifter, multiple input signals to generate multiple shifted input signals that are shifted by a specified number of clock cycles;
receiving, from the parity shifter, the multiple shifted input signals;
providing, to a command decoder, at least some of the shifted input signals corresponding to a command;
decoding, with the command decoder, the provided shifted input signals into a shifted and decoded command signal;
outputting, from the command decoder, the shifted and decoded command signal; and
providing, to a multiplexer:
the shifted input signals corresponding to the command, and
input signals corresponding to the command that have not been shifted by the parity shifter;
wherein the multiplexer is configured to provide the shifted input signals corresponding to the command to the command decoder in response to an indication of parity checking, and
wherein the multiplexer is configured to provide the input signals corresponding to the command that have not been shifted by the parity shifter to the command decoder when the multiplexer does not receive the indication of parity checking.

10. The method of claim 9,
wherein the outputting of the shifted and decoded command signal from the command decoder is in response to the multiplexer providing, to the command decoder, the shifted input signals corresponding to the command, and
wherein the command decoder outputs a decoded command signal that is not shifted for parity checking when the multiplexer provides, to the command decoder, the input signals corresponding to the command that have not been shifted by the parity shifter.

11. The method of claim 9, wherein the specified number of clock cycles that the parity shifter shifts the multiple inputs corresponds to a number of clock cycles used to perform parity checking.

12. The method of claim 9, wherein the method is performed by a DDR4 DRAM memory device.

13. The method of claim 9,
wherein the method is performed by a memory device comprising input pins; and
wherein the multiple inputs are received via the input pins.

14. A system comprising:
parity shifting means for receiving multiple input signals and providing multiple shifted input signals that are shifted by a specified number of clock cycles;
command decoding means for:
receiving at least some of the shifted input signals corresponding to a command;
decoding the received shifted input signals into a shifted and decoded command signal; and
providing the shifted and decoded command signal; and
multiplexing means for:
receiving the shifted input signals corresponding to the command;
receiving input signals corresponding to the command that have not been shifted by the parity shifting means;
providing the shifted input signals corresponding to the command to the command decoding means in response to an indication of parity checking; and
providing the input signals corresponding to the command that have not been shifted by the parity shifting means to the command decoding means when the multiplexing means do not receive the indication of parity checking.

15. The system of claim 14,
wherein the providing of the shifted and decoded command signal by the command decoding means is in response to the multiplexing means providing, to the command decoding means, the shifted input signals corresponding to the command, and
wherein the command decoding means provide a decoded command signal that is not shifted for parity checking when the multiplexing means provide, to the command decoding means, the input signals corresponding to the command that have not been shifted by the parity shifting means.

16. The system of claim 14, wherein the specified number of clock cycles that the parity shifting means shifts the multiple inputs corresponds to a number of clock cycles used to perform parity checking.

17. The system of claim 14, wherein the system is incorporated in a DDR4 memory device.

* * * * *